United States Patent
Washizu

(10) Patent No.: US 8,643,051 B2
(45) Date of Patent: Feb. 4, 2014

(54) LIGHT EMISSION DEVICE

(75) Inventor: Takashi Washizu, Tokyo (JP)

(73) Assignee: Konica Minolta Advanced Layers, Inc., Tokyo (JP)

( * ) Notice: Subject to any disclaimer, the term of this patent is extended or adjusted under 35 U.S.C. 154(b) by 0 days.

(21) Appl. No.: 13/517,418

(22) PCT Filed: Dec. 25, 2009

(86) PCT No.: PCT/JP2009/071593
§ 371 (c)(1),
(2), (4) Date: Jun. 20, 2012

(87) PCT Pub. No.: WO2011/077548
PCT Pub. Date: Jun. 30, 2011

(65) Prior Publication Data
US 2012/0256223 A1    Oct. 11, 2012

(51) Int. Cl.
*H01L 29/22* (2006.01)
(52) U.S. Cl.
USPC ............... 257/98; 257/100; 257/E33.061
(58) Field of Classification Search
USPC ............... 257/98–100, E33.056, E33.059, 257/E33.06, E33.061
See application file for complete search history.

(56) References Cited

U.S. PATENT DOCUMENTS

2006/0255716 A1* 11/2006 Tsutsumi et al. ............. 313/502
2009/0173957 A1*  7/2009 Brunner et al. ................ 257/98

FOREIGN PATENT DOCUMENTS

| JP | 2000-349346 | 12/2000 |
| JP | 2000-349347 | 12/2000 |
| JP | 2002-173675 | 6/2002 |
| JP | 2005-057239 | 3/2005 |
| JP | 2006-319238 | 11/2006 |
| JP | 2008-244357 | 10/2008 |

* cited by examiner

*Primary Examiner* — Matthew E Warren
(74) *Attorney, Agent, or Firm* — Lucas & Mercanti, LLP

(57) ABSTRACT

Disclosed are a light emission device comprising an LED element and a wavelength conversion section, the LED element emitting light of a specific wavelength and the wavelength conversion section converting the light emitted from the LED element to light of a specific wavelength, featured in that the wavelength conversion section is composed of a ceramic layer which has been formed employing, as a raw material, polysilazane containing a phosphor and inorganic fine particles with a particle size smaller than the phosphor.

7 Claims, 2 Drawing Sheets

LIGHT EMISSION DEVICE

CROSS REFERENCE TO RELATED APPLICATION

This Application is a 371 of PCT/JP2009/071593 filed on Dec. 25, 2009, incorporated by reference herein.

FIELD OF THE INVENTION

The present invention relates to a light emission device.

TECHNICAL BACKGROUND

Hitherto, a light emission device for use in an illuminator and the like has been developed which emits a white light by emitting light from a phosphor employing, as an excitation light, light emitted from an LED element.

As such a light emission device, there is known, for example, a light emission device which obtains a white light by employing a phosphor converting a blue light emitted from an LED element to a yellow light to emit the yellow light and mixing the blue light and the yellow light; or a light emission device which obtains a white light by employing a phosphor converting an ultraviolet light emitted from an LED element to a blue light, a green light and a red light to emit the blue, green and red lights and mixing the three color lights emitted from the phosphor.

As a light emission device, a light emission device has been developed which has a structure that an LED chip is directly sealed by a curable resin with a phosphor dispersed therein. Application of this light emission device expands in a field such as a headlight for cars and the like in which high luminance is required, and at the present, improvement of the output power of a white light emitting LED is carried out, which is accompanied by heat generation of the LED chip. Therefore, when a phosphor dispersed in a sealing agent is provided directly on an LED element as described above, the phosphor may deteriorate on account of heat generation of the LED element.

In order to solve the problem as described above, there has been proposed a technique in which an LED is sealed by a phosphor-dispersing ceramic but not by a phosphor-dispersing resin, whereby deterioration of a sealing agent used is prevented (see, for example, Patent Document 1.).

PRIOR ART DOCUMENT

Patent Document

Patent Document 1: Japanese Patent O.P.I. Publication No. 2000-349347

DISCLOSURE OF THE INVENTION

Problems to be Solved by the Invention

Preparation of a ceramic layer employing a sol-gel medium requires calcination processing at high temperature of not less than 700° C., which results in deterioration of a phosphor or an LED element. When a phosphor dispersed in a sol-gel medium or polysilazane is cured, gaps are produced at the interface between and the phosphor and the ceramic material obtained by curing the polysilazane, the produced gaps induce permeation of moisture, resulting in deterioration of the phosphor.

The present invention has been made in view of the above.

An object of the invention is to provide a light emission device which prevents deterioration of a phosphor or an LED element at a calcination step carried out at a high temperature of not less than 700° C. and deterioration of a phosphor due to permeation of moisture in the gaps produced at the interface between the phosphor and the ceramic material obtained by curing polysilazane.

Means for Solving the Problems

According to one embodiment of the invention, a light emission device is provided which comprises an LED element and a wavelength conversion section, the LED element emitting light of a specific wavelength and the wavelength conversion section converting the light emitted from the LED element to light of a specific wavelength, featured in that the wavelength conversion section is composed of a ceramic layer which has been formed employing, as a raw material, polysilazane containing a phosphor and inorganic fine particles with a particle size smaller than the phosphor.

Effects of the Invention

According to the present invention, the addition of a specific amount of inorganic fine particles in the polysilazane no longer requires the calcination processing at high temperature of not less than 700° C., whereby a ceramic layer containing a phosphor can be obtained without deterioration of the phosphor or the LED element. The inorganic fine particles can fill the gaps produced at the interface between the phosphor and the ceramic material prepared employing polysilazane as a raw material, and prevent moisture permeation in the gaps, resulting in prevention of deterioration of the phosphor.

PREFERRED EMBODIMENTS FOR CARRYING OUT THE INVENTION

Next a preferred embodiment of the invention will be explained in detail, referring to the figures.

Figure 1:
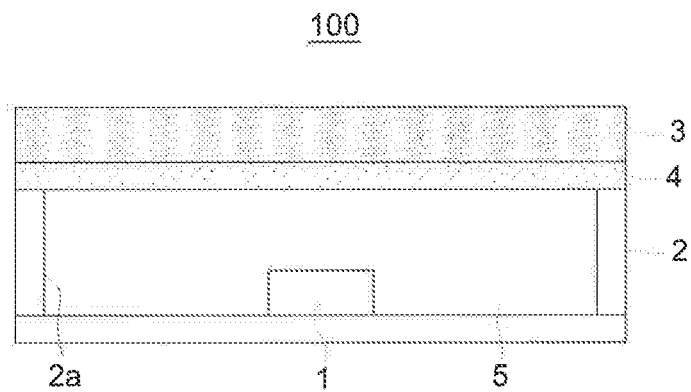
FIG. 1 is a schematic cross-sectional view of the light emission device of the invention.

FIG. 1 is a sectional view showing an outline structure of the light emission device.

The light emission device of the invention comprises an LED chip (light emission element) 1 emitting a light with a specific wavelength, an LED housing section 2 storing the LED chip 1, a condensing lens (an optical element) 3 provided above the LED chip 1, and a ceramic layer (a wavelength conversion section) 4 which is provided on the condensing lens 3 and which has been formed employing polysilazane as a raw material containing a phosphor and inorganic fine particles, the phosphor converting a light, which is emitted from the LED chip 1 and incident thereon, to a light of a specific wavelength.

The LED chip 1 emits light of a first specific wavelength, and in the embodiment in the invention, the LED chip 1 emits a blue light. However, in the invention, the wavelength of the light emitted from the LED chip 1 and that emitted from the phosphor are not limited, and a combination thereof may be any, as long as it is such that light emitted from the LED chip and light emitted from the phosphor have a mutually complementary relationship, and are mixed to emit a white light. In order to obtain the effects of the invention, it is preferred that the wavelength of the light emitted from the LED chip and that emitted from the phosphor be in the visible wavelength range, respectively.

As the LED chip 1 as described above, a known blue light emission LED can be used. As such a blue light emission LED chip, all known chips including an $In_xGa_{1-x}N$ based chip can be used. It is preferred that the peak emission wavelength of the blue light emission LED chip be in the range of from 440 to 480 nm. As the mounting types of the LED chip, there are the type, in which an LED chip is mounted on a substrate so that light emitted from the LED chip emanates upwards or laterally side; the so-called flip chip bonding type, in which bumps are formed on a blue LED chip mounted on a transparent substrate such as a sapphire substrate and the resulting material is reversed so as to connect the electrodes on a board; and the like. Any mounting type of the LED chip can be applied, but the flip chip type is preferred which is more suitable for manufacture of an LED chip of the type of high luminance or of the type employing a lens.

The LED housing section 2 is nearly box-shaped, and the LED chip 1 is fixed onto the center of the bottom of the LED housing section 2. It is preferred that a mirror material such as Al or Ag is provided on the inner wall surface 2a of the LED housing section 2. Further, a material for the LED housing section 2, although not specifically limited, is preferably one which excels in light reflectivity and hardly deteriorates due to light emitted from the LED chip 1.

The condensing lens 3 with a ceramic layer 4 farmed thereon is provided at the top portion of the LED housing section 2 and above the LED chip 1. The condensing lens 3 is a lens which condenses both light (a blue light) of a first specific wavelength emitted from the LED chip 1 and light (a yellow light) of a second specific wavelength emitted from the phosphor. The condensing lens, which is in the nearly flat plate form, is provided so as to cover the opening at the top portion of the LED housing section 2. The condensing lens 3 is composed of a low melting point glass, a metal glass or a resin.

A ceramic layer 4 is provided on the lower surface of the condensing lens 3 which is formed employing, as a raw material, polysilazane containing a phosphor and inorganic fine particles.

(Polysilazane)

The polysilazane used in the invention is one represented by the following Formula (1),

$$(R_1R_2SiNR_3)_n \quad (1)$$

In Formula (1), $R_1$, $R_2$ and $R_3$ independently represent a hydrogen atom, an alkyl group, an aryl group, a vinyl group, or a cycloalkyl group, provided that at least one of $R_1$, $R_2$ and $R_3$ represents a hydrogen atom; and n represents an integer of from 1 to 60. In Formula (1), it is preferred that $R_1$, $R_2$ and $R_3$ are simultaneously hydrogen atoms.

The molecular shape of the polysilazane may be in any shape, and may be, for example, in the straight chained or cyclic form.

The polysilazane represented by the above formula (1) is dissolved in a suitable solvent optionally together with a reaction accelerating agent, coated on a lens and heated or irradiated with excimer light or UV light to form a cured layer, whereby a ceramic layer having excellent resistance to heat and light is formed. As the reaction accelerating agent, an acid or a base is preferably used, but it need not be used. As the reaction accelerating agent, there are mentioned, for example, triethylamine, diethylamine, N,N-diethylethanolamine, N,N-dimethylethanolamine, triethanolamine, triethylamine, hydrochloric acid, oxalic acid, fumaric acid, sulfonic acid and acetic acid; and a metal carboxylate including nickel, palladium, iridium, platinum, titanium or aluminum, but the reaction accelerating agent is not specifically limited to these.

The metal carboxylate is especially preferably used as the reaction accelerating agent, and the added amount thereof is preferably from 0.01 to 5 mol %, based on the polysilazane used.

As a solvent, an aliphatic hydrocarbon, an aromatic hydrocarbon, halogenated hydrocarbon, an ether or an ester can be used. Preferred examples of the solvent include methyl ethyl ketone, tetrahydrofuran, benzene, toluene, xylene, dimethylformamide, chloroform, carbon tetrachloride, ethyl ether, isopropyl ether, dibutyl ether and ethyl butyl ether.

The higher concentration of the polysilazane is more preferred, but too a high content of the polysilazane results in shortening of the storage life. Therefore, it is preferred that the polysilazane is dissolved in a solvent in an amount of from 5 to 50% by weight.

(Inorganic Fine Particles)

In the inorganic fine particles used in the invention, a central particle size of the primary particle sizes is preferably from 0.001 to 0.5 µm.

The form of the inorganic fine particles is not specifically limited, but spherical inorganic fine particles are suitably used. Further, the particle size distribution of the fine particles is not specifically limited, however, in order to effectively exhibit the effects of the invention, fine particles with a relatively narrow particle size distribution are used more suitably, as compared with those with a broad particle size distribution. Incidentally, the form and particle size distribution both can be determined employing an SEM or a TEM.

As the inorganic fine particles, there are mentioned, for example, oxide fine particles. Examples of the inorganic fine particles include silicon oxide, titanium oxide, zinc oxide, aluminum oxide, zirconium oxide, hafnium oxide, niobium oxide, tantalum oxide, magnesium oxide, calcium oxide, strontium oxide, barium oxide, yttrium oxide, lanthanum oxide, cerium oxide, indium oxide, tin oxide, lead oxide, composite oxides formed from these oxides such as lithium niobate, potassium niobate and lithium tantalate, or phosphates, sulfates and the like.

These inorganic particles may be used singly or as an admixture of two or more kinds thereof. Further, inorganic particles having a composite composition may be used.

(Manufacturing Method and Surface Modification of Inorganic Particles)

The manufacturing method of the inorganic particles is not specifically limited, and can be carried out employing a known method. For example, when a halogenated metal or a metal alkoxide is used as a raw material, it is hydrolyzed in a reaction solution containing water, thereby obtaining an intended oxide fine particles. In this case, an organic acid or an organic amine can be used in combination in order to stabilize the fine particles. More specifically; when titanium dioxide fine particles are manufactured, a known method can be used which is disclosed in Journal of Chemical Engineering of Japan Vol. 31, No. 1, p. 21-28 (1998), and when zinc oxide fine particles are manufactured, a known method can be used which is disclosed in Journal of Physical Chemistry Vol. 100, p. 468-471 (1996). When hydrolysis is carried out in an appropriate solvent according to these methods, these particles can be easily manufactured by adding an appropriate surface modifier to the reaction solution. A surface modification method is not specifically limited, and can be carried out employing a known method. For example, there is mentioned a method in which particles are surface modified by hydrolysis in the presence of water. It is generally considered that in this method, a catalyst such as an acid or an alkali is suitably used, and a hydroxyl group on the particle surface and a hydroxyl group produced by hydrolysis of the surface modifier are subjected to dehydration reaction to forms a bond.

Examples of the surface modifier used include a silane coupling agent such as tetramethoxysilane, tetraethoxysilane, tetraisopropoxysilane, tetraphenoxysilane, methyltrimethloxysilane, ethyltrimethoxysilane, propyltrimethoxysilane, methyltriethoxysilane, methyltriphenoxysilane, ethyltriethoxysilane, phenyltrimethoxysilane, 3-methylphenyltrimethoxysilane, hexamethyldisilazane, dimethyldimethoxysilane, diethyldiethoxysilane, diethylchlorosilane, diphenyldimethoxysilane, diphenyldiphenoxysilane, trimethylmethoxysilane, triethylethoxysilane, triphenylmethoxysilane or triphenylphenoxysilane; and a titanium coupling agent such as tetrabutyl titanate, tetraoctyl titanate, isopropyltriisostearoyl titanate, tridecylbenzenesulfonyl titanate or bis(dioctylpyrophosphate)oxyacetate titanate.

Among these, silicon oxide, which has been surface modified with hexamethyldisilazane or dimetylchlorosilane, is especially preferred from the viewpoint of its compatibility with polysilazane or a solvent.

The surface modification of the inorganic particles as described above is effective to improve affinity between the particles and a solvent or to improve the dispersibility of the particles. However, such a surface modification incorporates a carbon component in the inorganic particles, resulting in deterioration of heat resistance, and therefore, the carbon content of the inorganic particles is preferably not more than 10% by weight.

(Phosphor)

The phosphor has a phosphor which converts a light with a first specific wavelength emitted from LED chip 1 to a light with a second specific wavelength LED. The embodiment of the light emission device of the invention is such that a blue light emitted from the LED chip 1 is converted to a yellow light.

With respect to a phosphor oxides or compounds likely to form oxide at high temperature condition are used as a starting material of Y, Gd, Sm, Al, La and Ga, and these are sufficiently mixed at a stoichimetric ratio to obtain a starting material of the phosphor. Alternatively, rare metal elements such as Y, Gd, Ce and Sm are dissolved in an acid at a stoichimetric ratio and added with oxalic acid to obtain co-precipitates, and the resulting co-precipitates were subjected to calcination to obtain a co-precipitate oxide. The co-precipitate oxide is mixed with aluminum oxide and gallium oxide to obtain a mixed starting material for the phosphor. Subsequently, these stating materials are mixed with a fluorine compound such as ammonium fluoride as a flux and pressed to obtain a mold. The resulting mold is placed in a crucible and subjected to calcination at 1350 to 1450° C. for two to five hours, thereby obtaining a sintered material having phosphor emission property.

Employing the thus obtained phosphor the inorganic fine particles and a polysilazane as a binder which is dissolved in a solvent, the mixture of the binder, the phosphor and the inorganic fine particles are prepared, coated on the bottom surface of the condensing lens and cured, whereby a ceramic layer 4 can be obtained which is formed employing, as a raw material, polysilazane containing the phosphor and the inorganic fine particles.

It is preferred that such a ceramic layer 4 contain a phosphor with a central particle size of from 5 to 50 μm in an amount of from 40 to 95% by weight and inorganic fine particles with a primary particle size of from 0.001 to 0.5 μm in an amount of from 0.1 to 25% by weight. This constitution not only enables more uniform dispersion of the phosphor in the ceramic layer 4 but also can effectively obtain moisture permeation preventing effect due to the inorganic fine particles.

It is preferred that the maximum thickness of the ceramic layer be from 5 to 500 μm. The lower limit of the maximum thickness of the ceramic layer is not specifically limited, but the ceramic layer thickness greater than the phosphor particle size can provide the effect of preventing permeation of moisture into the layer and prevent deterioration of the phosphor particles. Further it is preferred that the thickness of the ceramic layer be not more than 500 μm in view of preventing occurrence of cracks.

The above condensing lens 3 and the LED housing section 2 are bound to each other through a sealing agent so that the ceramic layer 4 provided on the bottom surface of the condensing lens 3 is in close contact with the upper surface of the LED housing section.

The space 5 is formed between the ceramic layer 4 and the bottom surface of the LED housing section 3, whereby the LED chip 1 is closely sealed inside the space 5, preventing the deterioration due to surrounding oxygen or humidity.

Further it is preferred that the space 5 be a low refractive index layer having a refractive index lower than that of the condensing lens 3. It is preferred that the low refractive index layer be, for example, a gas layer filled with gas, an air layer, or a resin layer. As the gas layer, for example, a layer, from which a gas such as nitrogen is purged, is preferred. The gas layer as the low refractive index layer facilitates the total reflection due to the inner wall surface 2a of a light which is emitted from the phosphor towards the condensing lens 3, which is a structure providing high usage efficiency of emission light from the phosphor.

Next, operation mechanism of the light emission device 100 will be explained.

When the LED chin 1 emits a blue light towards the outside, the blue light is incident on the phosphor of the ceramic layer 4 and the phosphor, excited by the blue light, emits a yellow light. Then, the blue light and the yellow light are mixed to make a white light which is emitted outside the LED housing section 2.

The light emission device 100 as described above can be suitably used as the headlight of a car and the like.

Figure 2:
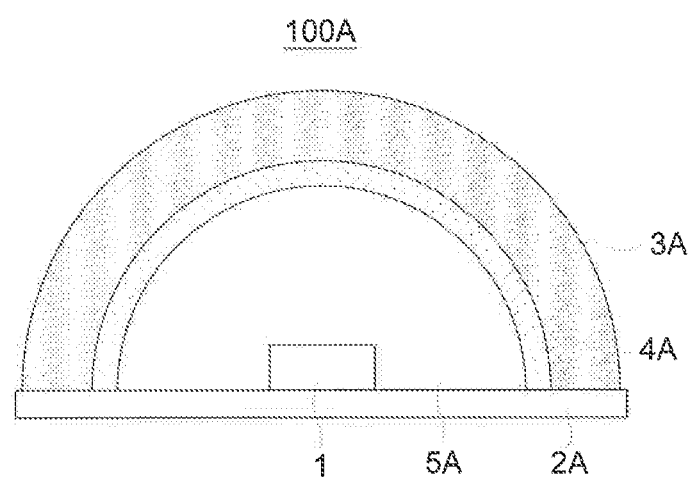
FIG. 2 is a schematic cross-sectional view of a modified embodiment of the light emission device.
Figure 3:
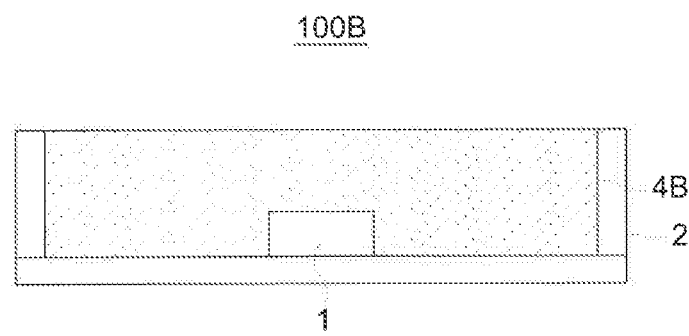
FIG. 3 is a schematic cross-sectional view of another modified embodiment of the light emission device.

Incidentally, the structure of the light emission device 100 is not limited to that as shown in FIG. 1 and may be that of the light emission device 100A as shown in FIG. 2 or 100B as shown in FIG. 3.

In the light emission device 100A as shown in FIG. 2, the ceramic layer 4A is provided on the curved surface of the lower surface of the condensing lens 3A in the dome form. The condensing lens 3A is provided above the LED chip 1 fixed onto the center of the upper surface of the substrate 2A in the nearly flat plate form.

The polysilazane containing the phosphor is coated on the bottom surface of the condensing lens 3A to form the ceramic layer 4A. The above condensing lens 3A and the substrate 2A are bound to each other through a sealing agent so that the condensing lens 3A and the bottom surface of the ceramic layer 4A are in close contact with the upper surface of the substrate 2A.

Incidentally, the space 5A formed between the ceramic layer 4A and the upper surface of the substrate 2A is preferably a low refractive index layer having a refractive index lower than that of the condensing lens 3A, as is the case with FIG. 1.

The form of the light emission or light incident surface of the condensing lens 3 or 3A is not limited to the above flat plate form or dome form, and may be any one such as non-spherical or cylindrical form, which is designed considering a light condensing property or light distribution property. The light emission surface having a fresnel structure with a light condensing property can thin the condensing lens, which enables further downsizing of the light emission device.

The light emission device 100B as shown in FIG. 3 is such that the ceramic layer 4 is provided in the LED housing section 2 as shown in FIG. 1, where a polysilazane solution containing the phosphor and the inorganic fine particles is coated on the side of the LED chip 1, cured and sealed.

In the invention, addition of a specific amount of the inorganic fine particles to the polysilazane enables curing at a low temperature of not more than 500° C., thereby obtain a phosphor-containing ceramic layer without deterioration of the phosphor.

Further, the inorganic fine particles can fill the space formed at the interface between the phosphor and the ceramic phase composed of the polysilazane. Accordingly, a ceramic layer containing the inorganic fine particles can prevent permeation of moisture and deterioration of the phosphor, as compared with a ceramic layer containing no inorganic fine particles.

EXAMPLES

Next, the present invention will be explained in detail, employing Examples and Comparative Examples. A blue light emitting LED used in all the samples prepared below had a size of 1000 μm×1000 μm×100 μm, and was mounted in the flip chip type.

(Preparation of Phosphor)

The yellow phosphor particles used were prepared according to the following procedures. The following raw material components for the phosphor were sufficiently mixed placed in an aluminum crucible, and mixed with a suitable amount of a fluorine compound as a flux such as ammonium fluoride. The resulting mixture was subjected to calcination at 1350 to 1450° C. for two to five hours at a reduction atmosphere where a hydrogen-containing nitrogen gas was flowing. Thus, a calcination product $((Y_{0.72}Gd_{0.24})_3Al_5O_{12}:Ce_{0.04})$ was obtained.

| | |
|---|---|
| $Y_2O_3$ | 7.41 g |
| $Gd_{23}$ | 4.01 g |
| $CeO_2$ | 0.63 g |
| $Al_2O_3$ | 7.77 g |

Thereafter; the calcination product obtained above was pulverized, washed, separated and dried to obtain an intended phosphor. The phosphor obtained above was further pulverized into phosphor particles with a particle size of about 10 μm, and used The composition of the resulting phosphor pars was analyzed and it was confirmed that the phosphor was an intended phosphor. When the phosphor was irradiated with an excitation light with a wavelength of 465 nm, the emission light from the phosphor had a peak emission wavelength of about 570 mm.

(Examination 1)

Fluorescence intensity of each of Samples prepared below was measured and evaluated as follows.

Comparative Example 1

Alkoxysiloxane was added to isopropyl alcohol to obtain a 20 wt % alkoxysiloxane solution. One gram of this alkoxysilane solution and 0.8 grams of the phosphor prepared above were mixed and the resulting mixed solution was coated on a 1 mm thick glass plate (condensing lens 3 of FIG. 1) according to a spin coating method. After coating the resulting material was subjected to calcination at 150° C. for one hour, and further at 700° C. for 3 hours. Thus, Sample of Comparative Example 1 was prepared. The coating thickness of this Sample was 50 μm.

Comparative Example 2

One gram of NL120 (20 wt %) (produced by AZ Electronic Materials Co., Ltd.) and 0.8 grams of the phosphor prepared above were mixed, and the resulting mixed solution was coated on a 1 mm thick glass plate (condensing lens 3 of FIG. 1) according to a spin coating method. After coating, the resulting material was subjected to calcination at 250° C. for one hour. Thus, Sample of Comparative Example 2 was prepared. The coating thickness of this Sample was 50 μm.

Comparative Example 3

One gram of NL120 (20 wt %) (produced by AZ Electronic Materials Co., Ltd.), 0.8 grams of the phosphor prepared above and 0.06 grams of inorganic particles (Micropearl SI with a particle size of 20 μm, produced by Sekisui Kagaku Kogyo Co., Ltd.) were mixed, and the resulting mixed solution was coated on a 1 mm thick glass plate (condensing lens 3 of FIG. 1) according to a spin coating method. After coating, the resulting material was subjected to calcination at 250° C. for one hour. Thus, Sample of Comparative Example 3 was prepared. The coating thickness of this Sample was 50 μm.

Example 1

One gram of NL120 (20 wt %) (produced by AZ Electronic Materials Co., Ltd.), 0.8 grams of the phosphor prepared above and 0.06 grams of inorganic particles (RX300 with a particle size of 7 nm, produced by Nippon Aerosil Co., Ltd.) were mixed, and the resulting mixed solution was coated on a 1 mm thick glass plate (condensing lens 3 of FIG. 1) according to a spin coating method. After coating, the resulting material was subjected to calcination at 250° C. for one hour. Thus, Sample of Example 1 was prepared. The coating thickness of this Sample was 50 μm.

Example 2

One gram of NL120 (20 wt %) (produced by AZ Electronic Materials Co., Ltd.), 0.8 grams of the phosphor prepare above and 0.06 grams of inorganic particles (RX300 with a particle size of 7 nm, produced by Nippon Aerosil Co., Ltd.) were mixed. The resulting mixed solution was dropped on the LED housing section 2 of FIG. 3 and subjected to calcination at 250° C. for one hour. The maximum coating thickness of this Sample was 400 μm.

[Evaluation Method]

Evaluation was carried out as follows, and the results are shown in Table 1.

(Concentration)

The portions to be measured were scraped from the phosphor-containing ceramic layer of each sample obtained above, and analyzed employing EDX (an energy dispersive X-ray fluorescence analyzer to determine the concentration of each of the constitutional components contained in the ceramic layer.

(Thickness)

The portions to be measured were scraped from the phosphor layer of each sample. The thickness of the phosphor layer was obtained by measuring the height difference between the sample before and after scraped, employing a measuring microscope F-A505H, produced by MITUTOYO Co., Ltd.

(Measurement of Fluorescence Intensity)

Measurement samples were prepared in the same manner as the Samples obtained above, provided that the phosphor in the ceramic layer of the measurement samples had the same content. Thereafter, the phosphor-containing ceramic layer was scraped off from each sample to obtain a powder specimen. The fluorescence intensity of the powder specimen was determined. Evaluation was carried out according to the following criteria:

A: Fluorescence intensity is not less than 90% of that of the Sample of Example 1.
B: Fluorescence intensity is from 80% to less than 90% of that of the Sample of Example 1.
C: Fluorescence intensity is from 70% to less than 80% of that of the Sample of Example 1.
D: Fluorescence intensity is less than 70% of that of the Sample of Example 1.

(Measurement of Fluorescence Intensity after Storage at High Temperature and High Humidity)

After each sample prepared above was stored at 85° C. and at 85% for 168 hours, the phosphor-containing ceramic layer was scraped off from each sample to obtain a powder specimen after storage. The fluorescence intensity of the powder specimen after storage was determined. Evaluation was carried out according to the following criteria:

A: Fluorescence intensity is not less than 90% of that of the sample after calcination.
B: Fluorescence intensity is from 80% to less than 90% of that of the sample after calcination.
C: Fluorescence intensity is from 70% to less than 80% of that of the sample after calcination.
D: Fluorescence intensity is less than 70% of that of the sample after calcination.

ing calcination. The Sample prepared employing polysilazane in Comparative Example 2 does not cause inactivation of the phosphor during calcination, but being affected by moisture, results in inactivation of the phosphor. The Sample prepared in Comparative Example 3 employing a too large particle size of the inorganic fine particle cannot fill the space formed at the interface and therefore cannot prevent permeation of moisture.

In contrast, Example 1 employing polysilazane prevents both inactivation of the phosphor during calcination and permeation of moisture. Example 2, even when the phosphor-containing layer is coated on the LED side, exhibits the same result as Example 1.

EXPLANATION OF THE SYMBOLS

1 LED Chip (LED Element)
2 LED Housing Section
3 Condensing Lens
4, 4A Ceramic Layer (Wavelength Conversion Section)
100, 100A Light Emission Device

The invention claimed is:

1. A light emission device comprising an LED element and a wavelength conversion section, the LED element emitting a first light of a first specific wavelength and the wavelength conversion section converting the first light emitted from the LED element to a second light of a second specific wavelength, wherein the wavelength conversion section is composed of a ceramic layer which has been formed from polysilazane, phosphor particles and inorganic fine particles with a particle size smaller than the phosphor particles.

2. The light emission device as described in claim 1, wherein the ceramic layer contains the phosphor particles with a central particle size of from 5 to 50 μm in an amount of from 40 to 95% by weight and the inorganic fine particles with a primary particle size of from 0.001 to 0.5 μm in an amount of from 0.1 to 25% by weight.

3. The light emission device as described in claim 1, wherein the maximum thickness of the ceramic layer is from 5 to 500 μm.

4. The light emission device as described in claim 1, wherein the polysilazane is dissolved in a solvent in an amount of from 5 to 50% by weight.

5. The light emission device as described in claim 1, wherein a carbon content of the inorganic fine particles is not more than 10% by weight.

TABLE 1

| | Binder | Fine Particles | Particle Size of Fine Particles | Coating Type | Concentration of Phosphor | Concentration of Inorganic Fine Particles | Maximum Thickness | Fluorescence Intensity after Calcination | Fluorescence Intensity after Storage at High Temperature and High Humidity |
|---|---|---|---|---|---|---|---|---|---|
| Comparative Example 1 | Sol-Gel | None | — | FIG. 1 | 80 wt % | — | 50 μm | D | D |
| Comparative Example 2 | Polysilazane | Nose | — | FIG. 1 | 80 wt % | — | 50 μm | A | C |
| Comparative Example 3 | Polysilazane | Present | 20 μm | FIG. 1 | 75 wt % | 5.6 wt % | 50 μm | A | C |
| Example 1 | Polysilazane | Present | 7 nm | FIG. 1 | 75 wt % | 5.6 wt % | 50 μm | — | A |
| Example 2 | Polysilazane | Present | 7 nm | FIG. 3 | 75 wt % | 5.6 wt % | 400 μm | A | A |

(Results of Examination 1)

The Sample prepared employing a sol-gel method in Comparative Example 1 causes deterioration of the phosphor dur- 6. The light emission device as described in claim 1, wherein the first and second specific wavelengths are in the visible wavelength range, respectively.

7. The light emission device as described in claim 1, wherein the first light is a blue light, and the second light is a yellow light.

* * * * *